United States Patent [19]

Takada et al.

[11] Patent Number: 4,965,151
[45] Date of Patent: Oct. 23, 1990

[54] SOLID-STATE ELECTROCHEMICAL CELL

[75] Inventors: Kazunori Takada, Osaka; Yasuharu Yamamura, Katano; Shigeo Kondo, Hirakata, all of Japan

[73] Assignee: Matsushita Electric Industrial Co., Ltd., Osaka, Japan

[21] Appl. No.: 468,555

[22] Filed: Jan. 23, 1990

[30] Foreign Application Priority Data

Jan. 24, 1989 [JP] Japan .................................. 1-15317
Mar. 17, 1989 [JP] Japan .................................. 1-67063
Jun. 9, 1989 [JP] Japan .................................. 1-147897
Aug. 23, 1989 [JP] Japan .................................. 1-216346

[51] Int. Cl.$^5$ ...................... H01M 4/54; H01M 6/18
[52] U.S. Cl. .................................. 429/191; 429/219
[58] Field of Search ............... 429/191, 199, 218, 219; 252/182.1

[56] References Cited

U.S. PATENT DOCUMENTS

| 4,060,672 | 11/1977 | Von Alpen | 429/191 |
| 4,237,204 | 12/1980 | Thompson | 429/191 X |
| 4,789,610 | 12/1988 | Kondo | 429/191 |
| 4,830,940 | 5/1989 | Keister et al. | 429/219 |

*Primary Examiner*—Anthony Skapars
*Attorney, Agent, or Firm*—Panitch, Schwarze, Jacobs & Nadel

[57] ABSTRACT

A solid-state electrochemical cell is disclosed that comprises at least one pair of electrodes and a silver-ion conductive solid-electrolyte layer disposed between the electrodes, wherein at least one of the electrodes contains as an electrode active material a compound oxide composed of silver and transition metal oxide. The electrochemical cell is used as a solid-state rechargeable battery, solid-state analogue memory cell, or the like.

13 Claims, 14 Drawing Sheets

SOLID-STATE ELECTROCHEMICAL CELL

BACKGROUND OF THE INVENTION

1. Field of the Invention

This invention relates to solid-state electrochemical cells such as solid-state batteries and solid-state analogue memory cells.

2. Description of the Prior Art

At the present, electrochemical cells such as batteries and the like that are widely used employ a liquid electrolyte. Such conventional electrochemical cells have the disadvantage of giving rise to leakage of the liquid electrolyte. To eliminate this disadvantage, solid-state electrochemical cells such as batteries and analogue memory cells that make use of a solid electrolyte have been developed. Because there is no danger of leakage of the electrolyte from a solid-state electrochemical cell, the reliability of such an electrochemical cell is greater than that of a conventional electrochemical cell that makes use of a liquid electrolyte. Also, with the use of a solid electrolyte, it is possible to produce thin electrochemical cells that are small.

Among such small, thin electrochemical cells, for example, solid-state batteries are useful as the electrical power source for backup of semiconductor memory elements. To ensure that information acquired will not be lost when the semiconductor memory element is detached from the printed circuit board, it is preferred that such a supplementary electrical power source (i.e., solid-state battery) and the semiconductor memory element be integrated in one piece and provided in the same package. A solid-state battery that is provided together with semiconductor elements in the same package is exposed to high temperatures when the package is sealed, when the semiconductor elements are soldered to the printed circuit board, and when the semiconductor elements are operated at high temperatures. Therefore, the solid-state battery must be stable at high temperatures.

As an example of a solid-state electrochemical cell, there are, for example, rechargeable batteries that make use of a copper-ion conductive solid electrolyte of the RbCl-CuCl-CuI system, and a positive-electrode active material of transition metal disulfides with a laminar structure such as $TiS_2$ and $NbS_2$, or copper Chevrel-phase compounds of the formula $Cu_xMo_6S_8$. As another solid-state battery that makes use of a copper-ion conductive solid electrolyte of the RbCl-CuCl-CuI system, there are solid-state lithium batteries in which metal lithium is used as the negative-electrode active material and various oxides or sulfides are used as the positive-electrode active material.

However, the above-mentioned solid electrolyte of the RbCl-CuCl-CuI system is readily decomposed by the water and oxygen in the air. Also, sulfides that can be used as the electrode active material are readily oxidized, particularly at high temperatures For that reason, solid-state electrochemical cells such as are described above must be made in a sufficiently dry atmosphere from which oxygen has been removed. Moreover, to ensure that stability at high temperatures will be maintained, it is necessary to prevent air from the outside from entering the cell. However, the seal made of resin in conventional solid-state electrochemical cells is imperfect. Therefore, it is necessary for the same kind of seal to be made as for electrochemical cells that make use of a liquid electrolyte, or else it is necessary to provide a hermetic seal. In solid-state lithium batteries as well, it is necessary to provide protection from the air because the metal lithium is readily oxidized.

There are methods that make use of a solid electrolyte of silver compounds that are stable against the water and oxygen in the air, used to overcome these problems. For example, there are primary batteries such as iodine/silver batteries and iodine complex/silver batteries, which make use of a silver-ion conductive solid electrolyte of the formula $aAgXbAg_2O\text{-}cM_kO_l$ (where X=I, Br, or Cl, and M=W, Mo, Si, V, Cr, P, or B) or $pAgX\text{-}qAgM_mO_n$ (where X=I, Br, or Cl, and M=W, Mo, Si, V, Cr, P, or B). However, these kinds of batteries have the disadvantage of emitting iodine at high temperatures. An appropriate electrode active material for secondary batteries that make use of a solid electrolyte such as described above has not yet been found.

When the above-mentioned solid-state batteries are used together with a semiconductor element, the following problems can arise. With a copper-ion conductive solid electrolyte of the RbCl-CuCl-CuI system, iodine is emitted from the electrolyte at high temperatures or as the effect of the permeation of water through the packaging material. The iodine emitted stains the resin that is used in the packing of the semiconductor element, which can cause a degradation in the insulation properties of the resin and which can degrade the characteristics of the semiconductor element in this package. The abovementioned solid-state metal lithium batteries contain, as the negative electrode, metal lithium, Wood's metal, Li-Pb alloy, or the like that have a low melting point. Therefore, the negative electrode may melt at high temperatures. The melted metal may diffuse in the silicon that constitutes part of the semiconductor element, degrading the characteristics of the semiconductor element. With solid-state batteries that make use of silver-ion conductive solid electrolytes, iodine gas is emitted at high temperatures from the iodine or iodine complex used as the positive-electrode material.

The solid-state analogue memory cells that have been developed include a silver-ion electron conductor that makes use of a silver-ion conductive solid electrolyte and $Ag_2Se\text{-}Ag_3PO_4$ electrodes. In these cells, there is a linear relationship between the amount of silver contained in the electrode and the chemical potential, and the relationship between the electricity fed to the cell and the electrode potential is also linear. However, in this system, the electricity and the electrode potential have a linear relationship only in the narrow range of electrode potentials of 0 to 100 mV; at an electrode potential of more than 100 mV, the electricity cannot be detected and stored. Moreover, there is the problem that the silver selenide used in the electrode is readily oxidized at high temperatures.

SUMMARY OF THE INVENTION

The solid-state electrochemical cell of this invention, which overcomes the above-discussed and numerous other disadvantages and deficiencies of the prior art, comprises at least one pair of electrodes and a silver-ion conductive solid-electrolyte layer disposed between the electrodes, wherein at least one of the electrodes contains as an electrode active material a compound oxide composed of silver and transition metal oxide.

In a preferred embodiment, the transition metal oxide comprises vanadium oxide.

In a preferred embodiment, the compound oxide is of the formula $Ag_xV_2O_{5-y}$ (where $x>0.35$ and $0\leq y<5$).

In a preferred embodiment, the abovementioned solid-state electrochemical cell is used as a solid-state rechargeable battery, wherein the pair of electrodes are a positive electrode and negative electrode for the battery and wherein at least one of the positive electrode and negative electrode contains a compound oxide of the formula $Ag_xV_2O_{5-y}$ (where $0.6\leq X\leq 0.8$ and $0\leq y<5$).

In a more preferred embodiment, the positive electrode contains a compound oxide of the formula $Ag_xV_2O_{5-y}$ (where $0.6\leq x\leq 0.8$ and $0\leq y<5$) and the negative electrode contains a compound oxide of the formula $Ag_vV_2O_{5-w}$ (where $0.6\leq v\leq 0.8$ and $0\leq w<5$).

In a more preferred embodiment, when the positive electrode contains M mole of $Ag_xV_2O_{5-y}$ and the negative electrode contains N mol of $Ag_vV_2O_{5-w}$, the condition $Q_1\leq Q_2$ is satisfied (where $Q_1=M(1.4x-0.55)$ when $0.6\leq x\leq 0.7$, and $Q_1=M(0.6x+0.01)$ when $0.7\leq x\leq 0.8$; $Q_2=N(0.6v-0.18)$ when $0.6\leq v\leq 0.7$, and $Q_2=M(-0.6v+0.66)$ when $0.7\leq v\leq 0.8$).

In a preferred embodiment, the abovementioned solid-state electrochemical cell is used as a solid-state analogue memory cell, wherein the pair of electrodes are a working electrode and counter electrode for the memory cell and wherein at least one of the working electrode and counter electrode contains a compound oxide of the formula $Ag_xV_2O_{5-y}$ (where $x>0.35$ and $0\leq y<5$).

In a more preferred embodiment, the working electrode contains a compound oxide of the formula $Ag_xV_2O_{5-y}$ (where $x>0.35$ and $0\leq y<5$) and the counter electrode contains a compound oxide of the formula $Ag_vV_2O_{5-w}$ (where $v>0.35$ and $0\leq w<5$).

In a more preferred embodiment, when the working electrode contains M mole of $Ag_xV_2O_{5-y}$ and the counter electrode contains N mol of $Ag_vV_2O_{5-w}$, the condition $Q_1\leq Q_2$ is satisfied (where $Q_1=M(0.7x-0.28)$ when $x>0.35$; $Q_2=N(0.6v-0.18)$ when $0.35\leq v\leq 0.7$, and $Q_2=N(-0.6v+0.66)$ when $v\leq 0.7$.

In a more preferred embodiment, the working electrode contains a compound oxide of the formula $Ag_xV_2O_{5-y}$ (where $x>0.35$ and $0\leq y<5$) and the counter electrode contains metal silver.

In a more preferred embodiment, the compound oxide is of the formula $Ag_xV_2O_{5-y}$ (where $0.35<x\leq 0.8$ and $0\leq y<5$).

In a preferred embodiment, the silver-ion conductive solid-electrolyte layer is composed of $aAgX\text{-}bAg_2O\text{-}cM_kOl$ (where X is selected from the group consisting of I, Br, and Cl; M is selected from the group consisting of W, Mo, Si, V, Cr, P, and B; and the relationships $0.1\leq a/(a+b+c)\leq 1.0$ and $2/7\leq k/\leq 2/3$ are satisfied).

In a preferred embodiment, the silver-ion conductive solid-electrolyte layer is composed of $pAgX_qAgM_mO_n$ (where X is selected from the group consisting of I, Br, and Cl; M is selected from the group consisting of W, Mo, SI, V, Cr, P, and B; and the relationships $0.1\leq p/(p+q)\leq 1.0$ and $1/5\leq m/n\leq 2/3$ are satisfied).

Thus, the invention described herein makes possible the objectives of (1) providing a solid-state electrochemical cell that operates stably at high temperatures; (2) providing a solid-state electrochemical cell that can be produced in the air because cell makes use of a silver-ion conductive solid electrolyte that is stable to water and oxygen; (3) providing a solid-state electrochemical cell that can be used as a solid-state rechargeable battery, which cell has a high energy density of electrodes, and excellent charging and discharging cycle characteristics; and (4) providing a solid-state electrochemical cell that can be used as a solid-state analogue memory cell, which cell has satisfactory linearity of the relationship between the electricity and the terminal voltage.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
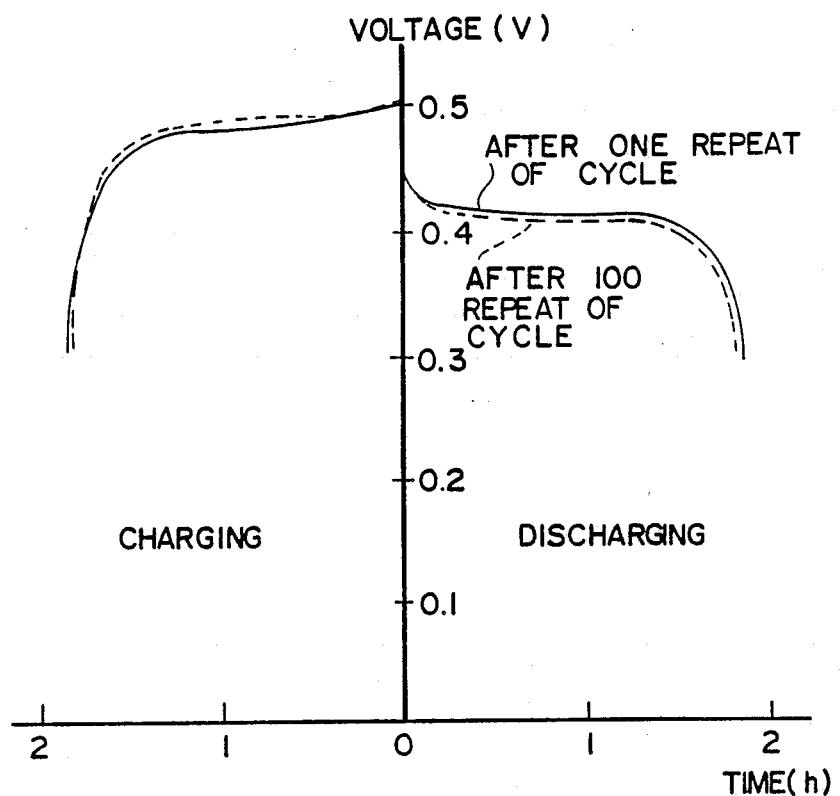
FIGS. 1 and 2 are graphs showing charging and discharging characteristic curves of the solid-state electrochemical cell obtained in Example 1 of this invention.

The solid-state electrochemical cell of this invention comprises at least one pair of electrodes and a silver-ion conductive solid-electrolyte layer disposed between the electrodes, wherein at least one of the electrodes contains as an electrode active material a compound oxide composed of silver and a transition metal oxide.

As used herein, the term "compound oxide" refers to any metal oxide with a higher structure that contains two or more kinds of metal ions. Examples of the compound oxide include vanadium bronzes of the formula, for example, $Ag_{0.7}V_2O_5$, but silver metavanadate of the formula $AgVO_3$ is not included therein.

The silver-ion conductive solid electrolytes used in the electrochemical cell of this invention can be those known in the art. For example, silver-ion conductive solid electrolytes of the formula $aAgX\text{—}bAg_2O\text{—}cM\text{-}$ $_kO_l$ (where X=I, Br, or Cl, and M=W, Mo, Si, or V) and silver-ion conductive solid electrolytes of the formula pAgX—qAgM$_m$O$_n$ (where X=I, Br, or Cl, and M=W, Mo, Si, or V) have no components that are hygroscopic, so that these electrolytes need not be prepared in a dry atmosphere. Because the solid electrolytes prepared are stable against the water and oxygen in the air, it is possible to store the electrolytes and to prepare the cells in the air. Moreover, the electrochemical cells that have been prepared by the use of these electrolytes are excellent in weatherproof properties. In particular, silver-ion conductive solid electrolytes of the formula pAgI—(1—p)Ag$_2$WO$_4$ (where $0.7 \leq p \leq 0.9$), which are prepared from silver iodide and silver tungstate, have a higher glass transition temperature than that of other electrolytes, and when the cells are left at high temperatures, the cell characteristics are almost unchanged by crystallization of the solid electrolyte. Therefore, such solid electrolytes are preferably used. Silver-ion solid electrolytes of the formula aAgX—bAg$_2$O—cM$_k$O$_l$ (where X=I, Br, or Cl, and M=Cr, P, or B) and silver-ion conductive solid electrolytes of the formula pAgX—qAgM$_m$O$_n$ (where X=I, Br, or Cl, and M=Cr, P, or B) contain hygroscopic components. However, because the solid electrolytes prepared are stable against humidity, they can also be used.

In this invention, a compound oxide that is composed of silver and at least one kind of transition metal oxide is used as the electrode active material. Vanadium oxide, tungsten oxide, and the like, which are widely used as the electrode active material in lithium batteries, are known to be stable against water and oxygen. However, silver ions are intercalated into these oxides only in small numbers, so that they cannot be used as the silver-ion conductive electrode active material. The compound oxide composed of silver and a transition metal oxide, which is used in this invention, is stable against water and oxygen, and also has a layered structure, and because the silver ions between the layers are electrochemically active, reversible intercalation and deintercalation occur. Thus, with the use of such a compound oxide as the electrode active material, a stable electrochemical cell with the conductivity of silver ions can be obtained. In particular, when vanadium oxide is included in the transition metal oxide, a compound oxide of the formula Ag$_x$V$_2$O$_{5-y}$ is preferred. Here, y is the number of oxygens that have been lost. Moreover, a compound oxide composed of silver and two or more kinds of transition metal oxides, such as Ag$_x$V$_{2-y}$W$_y$O$_{5-z}$, can also be used.

If the amount of silver contained in the compound oxide of the formula Ag$_x$V$_2$O$_{5-y}$ is small, a phase of Ag$_{0.35}$V$_2$O$_5$ can be formed. In this phase, the efficiency of the intercalation and deintercalation of the silver ions is low. Therefore, the electrochemical cell prepared with the use of this kind of compound oxide has low energy density. However, with a compound oxide in which the x of the above formula is greater than 0.35, intercalation and deintercalation of the silver ions occur efficiently, resulting in a superior electrochemical cell with high energy density.

When the electrochemical cell of this invention is used as a solid-state rechargeable battery, the pair of electrodes serve as the positive electrode and the negative electrode. When a compound oxide of Ag$_x$V$_2$O$_{5-y}$ is used as the electrode active material, it is preferred that x be 0.6 or more. With the use of a compound oxide that meets such a condition, a phase of Ag$_{0.35}$V$_2$O$_5$ is not substantially formed, which makes it possible to obtain a solid-state battery with high energy density. When an excessive amount of silver is contained in the compound oxide, metal silver appears in the compound oxide, and intercalation and deintercalation of the silver ions do not occur efficiently because of the degradation in the crystal structure, which causes a decrease in the energy density of the electrochemical cell. Therefore, it is preferred that the x of the above formula be 0.8 or less.

When the above-mentioned electrochemical cell is used as a rechargeable battery, the charging and discharging cycle characteristics should not be degraded by repetition of the charging and discharging cycle. When a silver-ion conductive solid-state electrochemical cell is used, the degradation in the charging and discharging cycle characteristics would be caused by the growth of dendrites of metal silver produced by a reduction reaction of silver ions. The dendrites of metal silver cause separation of the electrolyte from the electrode, and give rise to electrical shorts between the electrodes. To prevent the growth of dendrites of metal silver, it is necessary to cause intercalation of metal silver in the layer of the compound oxide, the metal silver being produced by the reduction reaction on the negative electrode. For one mole of the compound oxide of the formula Ag$_x$V$_2$O$_{5-y}$ (where $0.6 \leq x \leq 0.88$), deintercalation can be done with (1.4x—0.55) mol of silver when $0.6 \leq x \leq 0.7$, and deintercalation can be done with (0.6x+0.01) mol of silver when $0.7 \leq \leq 0.8$. Therefore, when M mol of the compound oxide is used as the positive-electrode active material, the amount Q$_1$ of silver that can be deintercalated therefrom is M(1.4x—0.55) mol when $0.6 \leq x \leq 0.7$, and M(0.6x+0.01) mol when $0.7 \leq x \leq 0.8$. For one mole of the compound oxide, intercalation can be done with (0.6x—0.18) mol of silver when $0.6 \leq x \leq 0.7$, and intercalation can be done with (—0.6x+0.66) mol of silver when $0.7 \leq x \leq 0.8$. Therefore, N mol of the compound oxide is used as the negative-electrode active material, the amount Q$_2$ of silver that can be intercalated therein is N(0.6x—0.18) mol when $0.6 \leq x \leq 0.7$, and N(—0.6x+0.66) mol when $0.7 \leq x \leq 0.8$. If Q$_2$ is greater than or equal to Q$_1$ (i.e., Q$_1 \leq$ Q$_2$), all of the silver ions deintercalated from the positive electrode can be intercalated in the negative electrode. Thus, even when the charging and discharging cycle is repeated, the growth of dendrites can be prevented, which makes it possible to obtain solid-state rechargeable batteries with excellent charge and discharge characteristics.

When the electrochemical cell of this invention is used as a solid-state analogue memory cell, the pair of electrodes serve as the working electrode and the counter electrode. In the case of a solid-state analogue memory cell, it is desirable that the cell has excellent charging and discharging cycle characteristics and satisfactory linearity of the relationship between the electricity and the terminal voltage.

To obtain a solid-state analogue memory cell with satisfactory linearity between the electricity and the terminal voltage, the potential of the working electrode should change linearly with respect to the electricity. With a compound oxide of the formula Ag$_x$V$_2$O$_{5-y}$, when silver is intercalated or deintercalated electrochemically, there is a region in which the chemical potential changes linearly with respect to the amount of silver. The linearity is preserved within the potential limits of from about 0 mV to about 200 mV, and when silver is further deintercalated, there is a plateau at the vicinity of about 450 mV. Therefore, when this electrochemical cell is used as an analogue memory cell, the electricity can be detected and stored in a range of potential about twice as large as that when the working electrode is made of a silver-ion electron conductor of the formula $Ag_2Se-Ag_3PO_4$.

With the above compound oxide, when the amount of silver contained is small, electrochemical intercalation and deintercalation of silver do not occur as described above. For that reason, when this compound oxide is used as the active material for the working electrode, it is preferred that the x value in $Ag_xV_2O_{5-y}$ be greater than 0.35. When the amount of silver contained is great, metal silver remains in the prepared material. The chemical potential changes by means of an electrochemical resolution and deposition reaction, and the linearity of the relationship between the electricity and the output voltage is slightly worsened. It is preferred that x be less than or equal to 0.8 because then there will be no metal silver left in the compound oxide.

At the counter electrode, the oxidation and reduction of silver should occur reversibly. Also, it is necessary that there be no change in the chemical potential, or else that the chemical potential changes linearly with respect to the electricity. It is preferred to use metal silver, because then there is no change in the chemical potential with respect to the electricity. Also preferred is a compound oxide of the formula $Ag_xV_2O_{5-y}$, because with its use, the chemical potential changes linearly with respect to the electricity. When metal silver is used as the electrode, the cell can be miniaturized because of the increased electrical capacity per unit volume.

However, as described above, in an electrochemical cell that makes use of a silver-ion conductive solid electrolyte, dendrites readily form on the electrodes. In particular, when the electrochemical cell is used repeatedly with a great electricity, the growth of dendrites occurs readily, resulting in electrical shorts between the electrodes through the solid-electrolyte layer, and the deposition of metal silver occurs readily, resulting in a separation of the electrodes from the electrolyte layer. To overcome this difficulty, and to obtain excellent cycle characteristics, it is preferred that the counter electrode be made of an active material in which silver can be intercalated, as described above. As the material for the counter electrode in a cell with a large electrical capacity, the compound oxides mentioned above are preferred because silver can be intercalated in and deintercalated from the spaces between the layers.

To completely prevent the deposition of metal silver, it is necessary that the amount of silver intercalated in the counter electrode be larger than the amount of silver deintercalated from the working electrode. The amount of silver deintercalated from $Ag_xV_2O_{5-y}$, which remains linear in relation to the changes in its chemical potential, is about $(0.7x-0.28)$ mol per mole of $Ag_xV_2O_{5-y}$; the amount of silver intercalated in $Ag_xV_2O_{5-y}$, which also remains linear in relation to the changes of its chemical potential, is about $(0.6x-0.18)$ mol when $x \leq 0.7$, and about $(-0.6x+0.66)$ mol when $x \geq 0.7$. This shows that when the working electrode contains M mol of $Ag_xV_2O_{5-y}$ and the counter electrode contains N mol of $Ag_vV_2O_{5-w}$, $M(0.7x-0.28)$ mol of silver can be deintercalated from the working electrode; and $N(0.6v-0.18)$ mol of silver can be intercalated in the counter electrode when $v \leq 0.7$, and $N(-0.6v+0.66)$ mol of silver can be intercalated in the counter electrode when $v \geq 0.7$. Therefore, solid-state electrochemical cells with excellent charging and discharging cycle characteristics can be obtained by allowing the relationship $Q_1 \leq Q_2$ to hold where $Q_1 = M(0.7x-0.28)$ when $x > 0.35$; $Q_2 = N(0.6v-0.18)$ when $0.35 < v \leq 0.7$, and $Q_2 = N(-0.6v+0.66)$ when $v \geq 0.7$.

The invention will be further described by reference to the following examples.

EXAMPLE 1

A 4:1:1 molar mixture of AgI, $Ag_2O$ and $WO_3$ was ground in an alumina mortar. This mixture was formed into pellets with the application of pressure, and the pellets were put into a Pyrex tube that was then sealed at reduced pressure. The tube was heated at 400° C. for 17 hours, so that the mixture was melted and allowed to react. The reaction mixture was ground in a mortar to 200 mesh or finer, and the product was a silver-ion conductive solid electrolyte of the formula $4AgI \cdot Ag_2WO_4$.

A 1:0.7 molar mixture of $V_2O_5$ and metal silver was ground in a mortar. The mixture was formed into pellets with the application of pressure, and the pellets were put into a quartz tube that was then sealed at reduced pressure. The tube was heated at 600° C. for 48 hours, and the mixture was allowed to react. The reaction mixture was ground in a mortar to 200 mesh or finer, and the product was a compound oxide of the formula $Ag_{0.7}V_2O_5$.

A 1:1 mixture by weight of the solid electrolyte and the compound oxide obtained as described above was used for the electrode material in a solid-state electrochemical cell. First, 200 mg of this electrode material was formed into electrode pellets of 10 mm$\phi$ with the application of 4 tons/cm$^2$ pressure. Two such electrode pellets were used as the positive electrode and the negative electrode. Then, 400 mg of the solid electrolyte was disposed between the electrode pellets, and the whole was formed into cell contents with the application of 4 tons/cm$^2$ pressure. The cell contents were connected with tin plated copper leads as the terminals by the use of carbon paste, and then sealed by the application of epoxy resin overall, resulting in a solid-state electrochemical cell 1. The cell was produced in the air.

Figure 2:
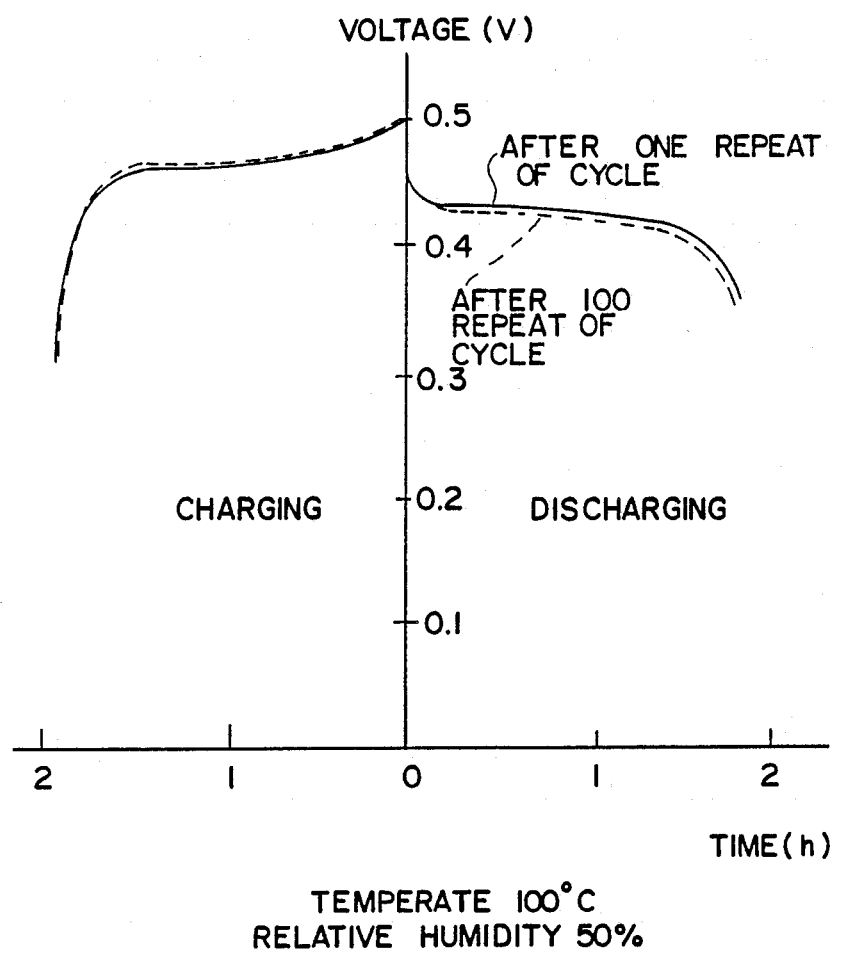

The solid-state electrochemical cell 1 obtained in this way was evaluated in a test of controlled charging and discharging at the constant current of 1 mA and the voltage of 0.3 to 0.5 V. The temperature was 20° C. and the relative humidity was 50%. The same test was conducted at the temperature of 100° C. and with the relative humidity of 50%. These results are shown in FIGS. 1 and 2, respectively. After charging and discharging 100 times under these sets of conditions, there was no significant change in the charging and discharging curves obtained. Therefore, the solid-state electrochemical cell of this example will operate stably even at high temperatures.

COMPARATIVE EXAMPLE 1

In the same way as in Example 1, except that a copper Chevrel-phase compound of the formula $Cu_2Mo_6S_8$ was used as the electrode active material and a copper-ion conductive solid electrolyte of the formula $RbCu_4I_{1.75}Cl_{3.25}$ was used as the solid electrolyte, a solid-state electrochemical cell 2 was produced in the air.

Furthermore, a solid-state electrochemical cell 3 was produced in the same way as mentioned above, except for the preparation of the cell in a dry box with a relative humidity of 0.1% or less.

Figure 3:
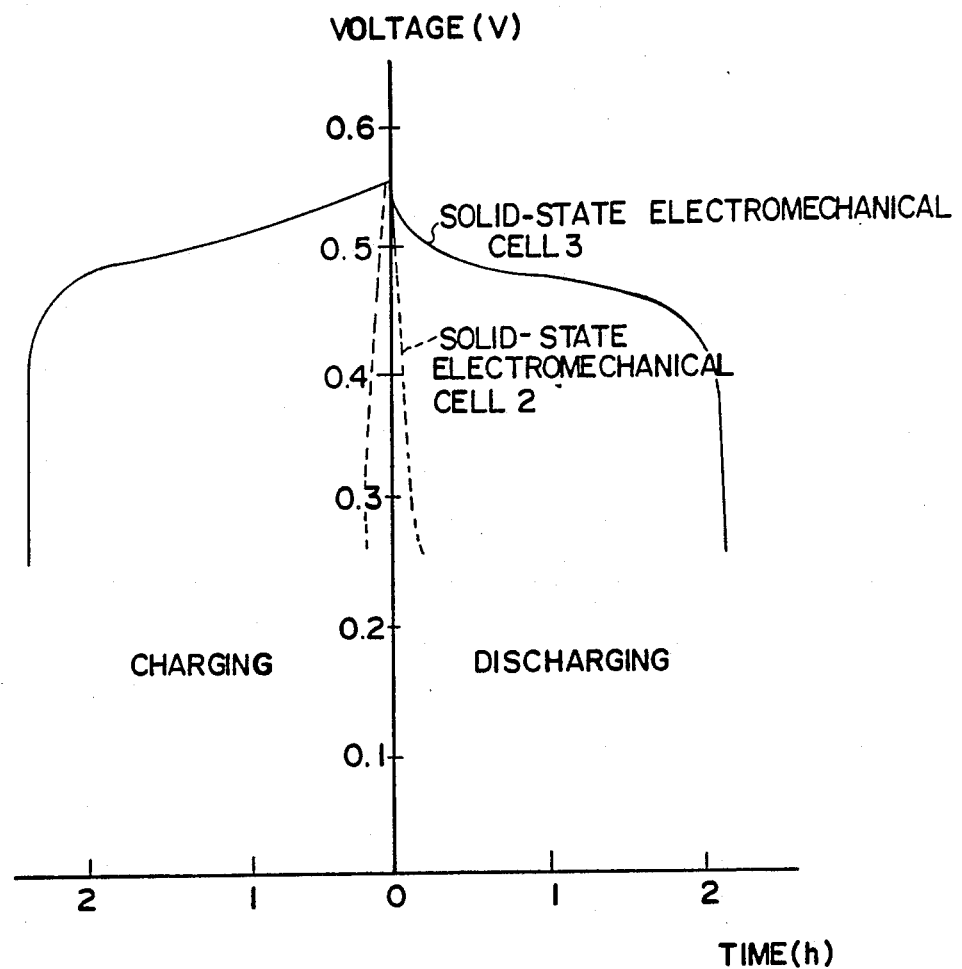
FIG. 3 is a graph showing charging and discharging characteristic curves of the solid-state electrochemical cells obtained in Comparative Example 1.

These solid-state electrochemical cells were evaluated in tests of controlled charging and discharging at the constant current cf 1 mA and the voltage of 0.3 to 0.55 V. These tests were conducted at the temperature of 20° C. in a dry atmosphere in a dessicator that contained $P_2O_5$. The results are shown in FIG. 3. The figure indicates that the charging and discharging capacity of the solid-state electrochemical cell 2 was 1/10 or less than that of the solid-state electrochemical cell 3. Thus, satisfactory charging and discharging cycle characteristics could not be obtained with the solid-state electrochemical cell 2 produced in the air.

COMPARATIVE EXAMPLE 2

In the same way as in Example 1, except that $NbS_2$ was used as the positive-electrode active material and powdered metal silver was used as the negative-electrode active material, a solid-state electrochemical cell 4 was produced.

Figure 4:
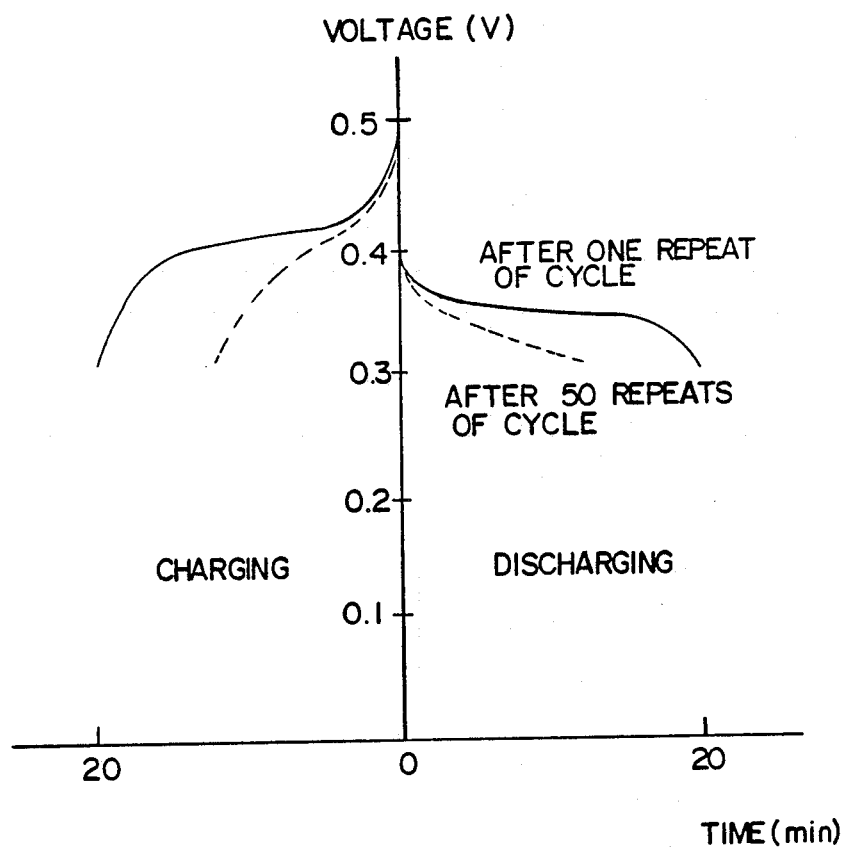
FIG. 4 is a graph showing charging and discharging characteristic curves cf the solid-state electrochemical cell obtained in Comparative Example 2.

The solid-state electrochemical cell 4 was evaluated in a test of controlled charging and discharging at the constant current of 1 mA and the voltage of 0.3 to 0.5 V. The test was conducted at the temperature of 100° C. and with the relative humidity of 50% in the air. The results are shown in FIG. 4. The figure indicates that the cell capacity of the solid-state electrochemical cell 4 decreased after charging and discharging were repeated 50 times. Thus, the cell characteristics of the solid-state electrochemical cell 4 were readily degraded at high temperatures.

EXAMPLE 2

This example will describe the evaluation of various compound oxides, which are composed of silver and vanadium oxide, as the active material for the positive electrode of a solid-state electrochemical cell.

A 3:2:1 molar mixture of AgI, $Ag_2O$, and $P_2O_5$ was ground in an alumina mortar. The mixture was formed into pellets with the application of pressure, and the pellets were put into a quartz tube that was then sealed at reduced pressure. The tube was heated at 600° C. for 17 hours, so that the mixture was melted and allowed to react. Then, the contents of the quartz tube were cooled rapidly in cold water. The reaction mixture obtained was ground in a mortar to 200 mesh or finer, and the product was a silver-ion conductive solid electrolyte of the formula $3AgI.Ag_4P_2O_7$.

The procedures of Example 1 were used to produce seven kinds of compound oxides, $Ag_{0.3}V_2O_5$, $Ag_{0.5}V_2O_5$, $Ag_{0.6}V_2O_5$, $Ag_{0.65}V_2O_5$, $Ag_{0.8}V_2O_5$, $Ag_{1.0}V_2O_5$, and $Ag_{1.2}V_2O_5$, by the use of $V_2O_5$ and metal silver at the molar ratios of 1:0.3, 1:0.5, 1:0.6, 1:0.65, 1:0.8, 1:1.0, and 1:1.2.

The solid electrolyte obtained above and the $Ag_{0.7}V_2O_5$ obtained in Example 1 or one of the various compound oxides obtained above were mixed in a 1:1 ratio by weight, and the mixture was used as the material for the positive electrode of a solid-state electrochemical cell. Then, 200 mg of this electrode material was formed into an electrode pellet of 10 mm$\phi$ with the application of 4 tons/cm$^2$ pressure.

As the material for obtaining a reference potential, metal silver was used. A 1:1 mixture by weight of powdered metal silver and the solid electrolyte obtained above was prepared, and 200 mg of the mixture was formed into an electrode pellet of 10 mm$\phi$ with the application of 4 tons/cm$^2$ pressure, as described above.

Next, 400 mg of the solid electrolyte was disposed between the electrode pellets prepared above, and the whole was formed into cell contents with the application of 4 tons/cm$^2$ pressure. The cell contents were connected with tin-plated copper leads as the terminals by the use of carbon paste, and then sealed by the application of epoxy resin overall, resulting in a solid-state electrochemical element 5 ($Ag_{0.7}V_2O_5$ was used as the active material). Also, other solid-state electrochemical cells were obtained as follows: cell 6, with $Ag_{0.3}V_2O_5$ as the active material; cell 7, with $Ag_{0.5}V_2O_5$ as the active material; cell 8, with $Ag_{0.6}V_2O_5$ as the active material; cell 9, with $Ag_{0.65}V_2O_5$ as the active material; cell 10, with $Ag_{0.8}V_2O_5$ as the active material; cell 11, with $Ag_{1.0}V_2O_5$ as the active material; and cell 12 with $Ag_{1.2}V_2O_5$ as the active material.

Figure 5:
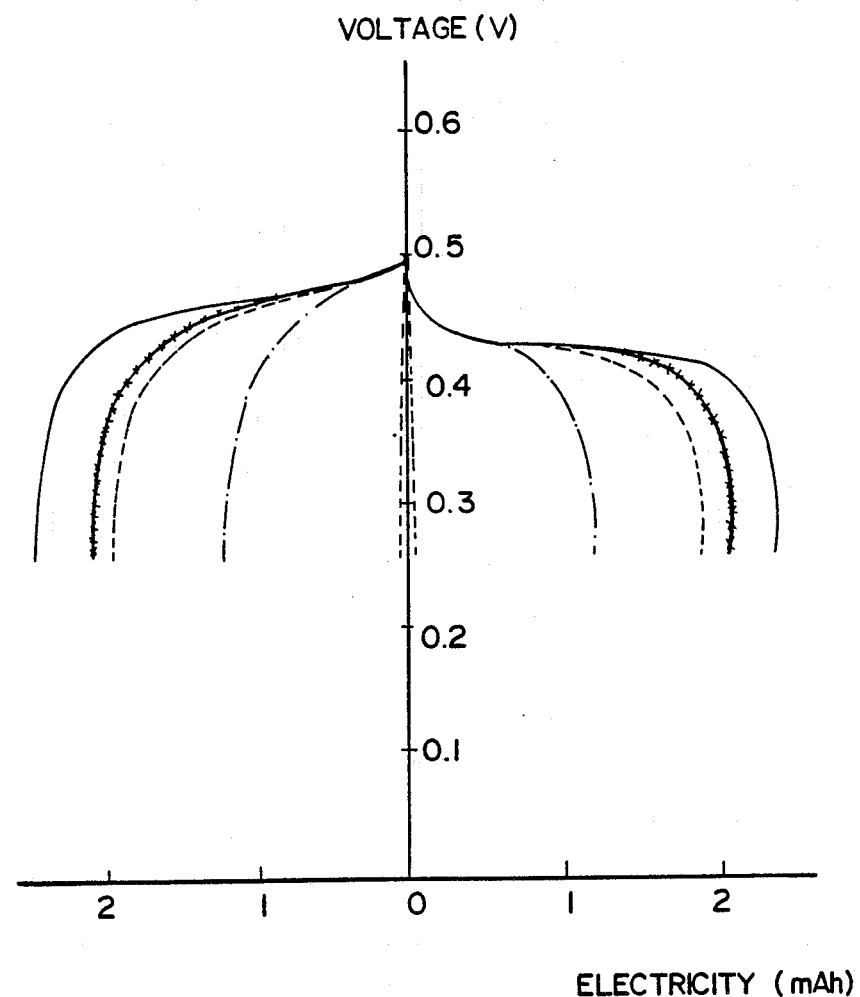
FIGS. 5 and 6 are graphs showing charging and discharging characteristic curves of the solid-state electrochemical cells obtained in Example 2 of this invention.
Figure 6:
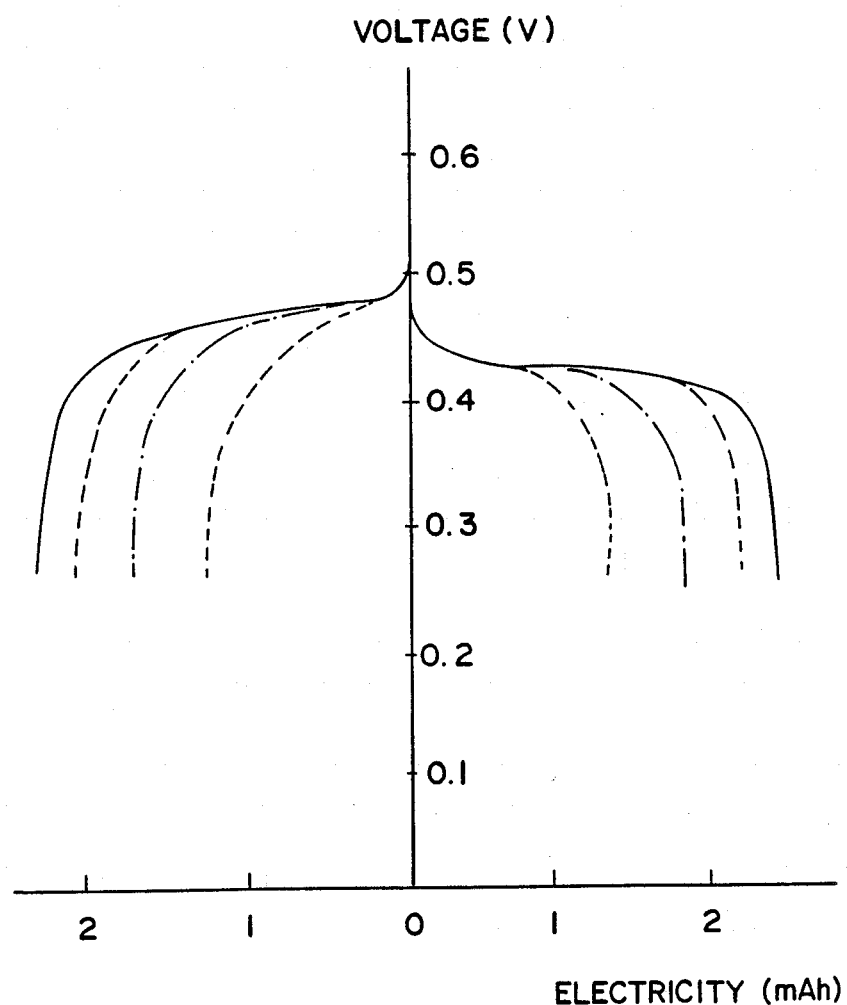

The solid-state electrochemical cells 5 to 12 were evaluated in tests of controlled charging and discharging at the constant current 1 mA and the voltage of 0.25 to 0.5 V. These tests were conducted at the temperature of 20° C. The results are shown in FIGS. 5 and 6. With solid-state electrochemical cell 6, in which $Ag_{0.3}V_2O_5$ was used as the active material, the charging and discharging capacities were extremely small, whereas the charging and discharging capacities of the solid-state electrochemical cells 5, 7, 8, 9, 10, 11, and 12 were all high. In particular, with the solid-state electrochemical cells 5, 7, 8, 9, and 10, in which the active material was a compound oxide of the formula $Ag_xV_2O_{5-y}$ (where $0.6 \leq x \leq 0.8$), the charging and discharging capacities were all high.

EXAMPLE 3

This example will describe the evaluation of various compound oxides, which are composed of silver and vanadium oxide, as the active material for the negative electrode of a solid-state electrochemical cell.

A 3:1 molar mixture of AgI and $Ag_2MoO_4$ was ground in an alumina mortar. The mixture was heated in a Pyrex tube at 500° C. for 10 hours, so that the mixture was melted and allowed to react. After this reaction, the molten liquid was rapidly cooled by injection into liquid nitrogen. The reaction mixture obtained was ground in a mortar to 200 mesh or finer, and the product was a silver-ion conductive solid electrolyte of the formula $3AgI.Ag_2MoO_4$.

The silver-ion conductive solid electrolyte obtained above was used to produce various solid-state electrochemical cells in the same way as in Example 2. The solid-state electrochemical cells obtained were as follows: cell 13, with $Ag_{0.7}V_2O_5$ as the active material; cell 14, with $Ag_{0.3}V_2O_5$ as the active material; cell 15, with $Ag_{0.5}V_2O_5$ as the active material; cell 16, with $Ag_{0.6}V_2O_5$ as the active material; cell 17, with $Ag_{0.65}V_2O_5$ as the active material; cell 18, with $Ag_{0.8}V_2O_5$ as the active material; cell 19, with $Ag_{1.0}V_2O_5$ as the active material; and cell 20, with $Ag_{1.2}V_2O_5$ as the active material.

Figure 7:
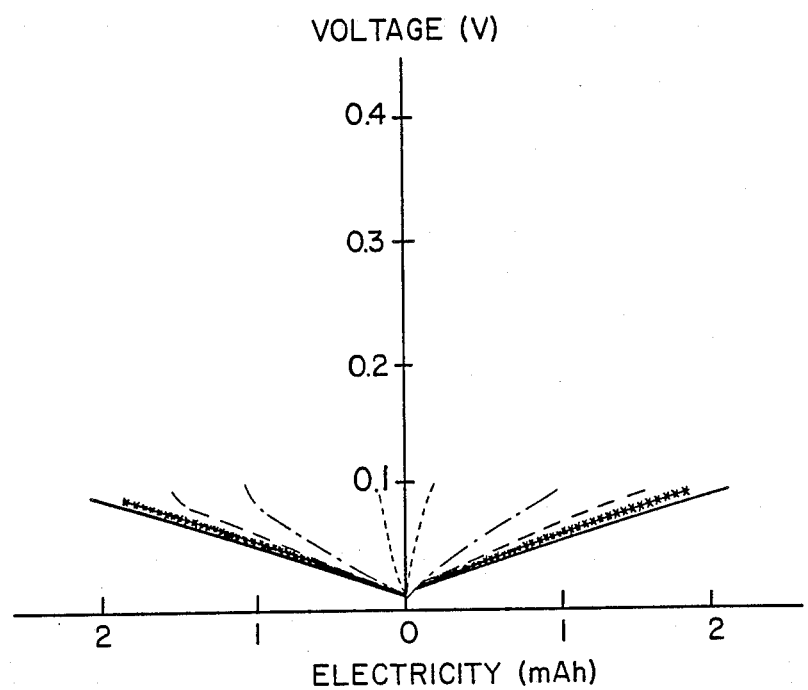
FIGS. 7 and 8 are graphs showing charging and discharging characteristic curves of the solid-state electrochemical cells obtained in Example 3 of this invention.
Figure 8:
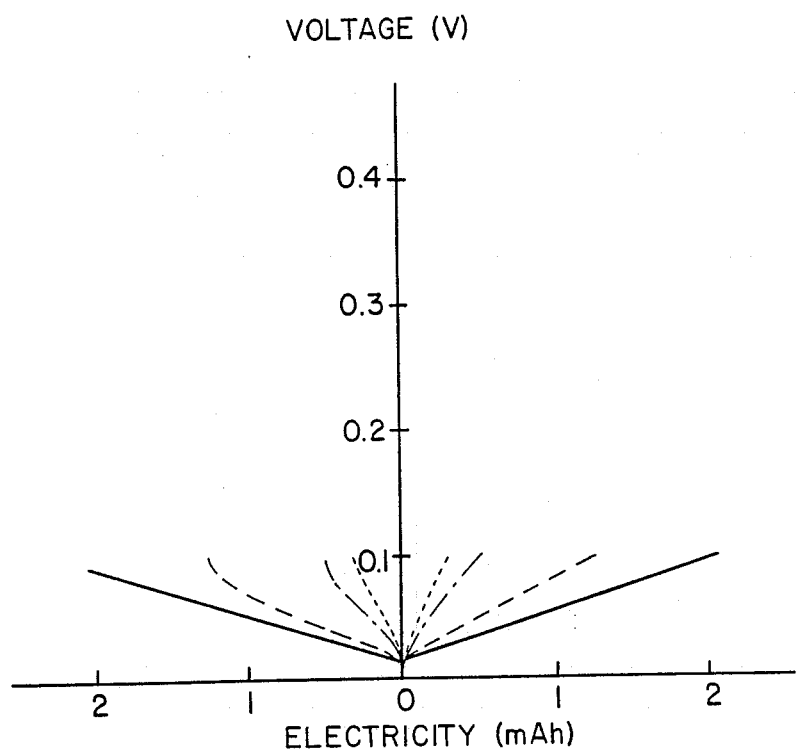

The solid-state electrochemical cells 13 to 20 were evaluated in tests of controlled charging and discharging at the constant current of 1 mA under the voltage of 0.1 to 0 V. These tests were conducted at the temperature of 20° C. The results are shown in FIGS. 7 and 8.

With the solid-state electrochemical cell 14, in which $Ag_{0.3}V_2O_5$ was used as the active material, the charging and discharging capacities were very small, whereas the solid-state electrochemical cells 13, 15, 17, 18, 19, and 20 had satisfactory charging and discharging capacities. In particular, with the solid-state electrochemical cells 13, 16, 17, and 18, in which the active material was a compound oxide of the formula $Ag_xV_2O_{5-y}$ (where $0.6 \leq x \leq 0.8$), the charging and discharging capacities were all high.

EXAMPLE 4

First, electrode active material for solid-state electrochemical cells were obtained by the 1:1 mixture by weight of the compound oxide of the formula $Ag_{0.7}V_2O_5$ and the silver-ion conductive solid electrolyte of the formula $4AgI.Ag_2WO_4$, both of which were obtained in Example 1.

Then, 100 mg of this electrode material was formed into a positive-electrode pellet of 10 mm$\phi$ with the application of 4 tons/cm$^2$ pressure. A negative-electrode pellet of 10 mm$\phi$ was prepared from 200 mg of the same electrode material with the application of the same amount of pressure, 4 tons/cm$^2$.

Next, 400 mg of the silver-ion conductive solid electrolyte of the formula $4AgI\ Ag_2WO_4$ was disposed between the positive-electrode pellet and the negative-electrode pellet, and the whole was formed into cell contents with the application of 4 tons/cm$^2$ pressure. The cell contents were connected with tin-plated copper leads as the terminal by the use of carbon paste, and then sealed by the application of epoxy resin overall, resulting in a solid-state electrochemical cell 21.

In the solid-state electrochemical cell 21 obtained in this way, the amount M of compound oxide contained in the positive electrode was $1.9 \times 10^{-4}$ mol and the amount N of compound oxide contained in the negative electrode was $3.9 \times 10^{-4}$ mol. The amount $Q_1$ of silver capable of being deintercalated was $8.3 \times 10^{-5}$ mol and the amount $Q_2$ of silver capable of being intercalated was $9.3 \times 10^{-5}$ mol. Therefore, the condition $Q_1 \leq Q_2$ was satisfied.

Another solid-state electrochemical cell 22 was produced in the same way as mentioned above, except that 100 mg of the same electrode material was used to form the negative-electrode pellet with the application of pressure.

For the solid-state electrochemical cell 22,
$M = 1.9 \times 10^{-4}$ mol,
$N = 1.9 \times 10^{-4}$ mol,
$Q_1 = 8.3 \times 10^{-5}$ mol,
and $Q_2 = 4.7 \times 10^{-5}$ mol.
Therefore, the condition $Q_1 \leq Q_2$ was not satisfied.

The solid-state electrochemical cells obtained above were evaluated for charge and discharge characteristics in the same way as in Example 2. The results of repeated charging and discharging showed that solid-state electrochemical cell 22 could no longer be charged after 182 repeats of the cycle because of a minute electrical short in the cell. There was no change in the charge and discharge characteristics of the solid-state electrochemical cell 21 after 300 repeats of the cycle.

EXAMPLE 5

A 5:3:2 molar mixture of AgI, Ag$_2$O, and V$_2$O$_5$ was ground in an alumina mortar. The mixture was put into a glassy carbon crucible and melted by the addition of heat. After the reaction, the molten liquid was rapidly cooled by injection into liquid nitrogen. The reaction material obtained was ground in a mortar to 200 mesh or finer, and the product was a silver-ion conductive solid electrolyte of the formula $5AgI\ 3Ag_2O\ 2V_2O_5$.

The compound oxide of the formula $Ag_{0.8}V_2O_5$ obtained in Example 2 was used as the electrode active material. The silver-ion conductive solid electrolyte obtained above was mixed with this compound oxide in a 1:3 ratio to give an active material for the positive electrode of a solid-state electrochemical cell, and mixed in a 3:1 ratio to give an active material for the negative electrode of a solid-state electrochemical cell.

Next, 200 mg of the positive-electrode material and 200 mg of negative-electrode material were formed into a positive-electrode pellet of 10 mm$\phi$ and a negative-electrode pellet of 10 mm$\phi$ with the application of 4 tons/cm$^2$ pressure, respectively.

Then, 400 mg of the solid electrolyte obtained above was disposed between the positive-electrode pellet and the negative-electrode pellet, and the whole was formed into cell contents with the application of 4 tons/cm$^2$ pressure as described in Example 4. The cell contents were connected with tin-plated copper leads as the terminals by the use of carbon paste, and then sealed by the application of epoxy resin overall, resulting in a solid-state electrochemical cell 23.

The solid-state electrochemical cell 23 obtained in this way had
$M = 1.9 \times 10^{-4}$ mol,
$N = 5.6 \times 10^{-4}$ mol,
$Q_1 = 9.1 \times 10^{-5}$,
and $Q_2 = 1.0 \times 10^{-5}$.
Therefore, the condition $Q_1 \leq Q_2$ was satisfied.

The compound oxide of the formula $Ag_{0.8}V_2O_5$ obtained in Example 2 as the electrode active material was mixed with the above silver-ion conductive solid electrolyte at the ratio of 1:1 by weight, and the mixture was used as the positive-electrode material of the solid-state electrochemical cell; a solid-state electrochemical cell 24 was produced as described above except for the use of this material.

The solid-state electrochemical cell 24 obtained in this had
$M = 3.7 \times 10^{-4}$ mol,
$N = 5.6 \times 10^{-4}$ mol,
$Q_1 = 1.8 \times 10^{-4}$,
and $Q_2 = 1.0 \times 10^{-4}$.
Therefore, the condition $Q_1 \leq Q_2$ was not satisfied.

The charge and discharge characteristics of the cells were evaluated as in Example 2. The results showed that a minute electrical short developed in the solid-state electrochemical cell 24 after 107 repeats of the cycle of charging and discharging. With the solid-state electrochemical cell 23, there was no change in the charge and discharge characteristics after 300 repeats of the cycle.

EXAMPLE 6

A 3:2:1 molar mixture of AgI, Ag$_2$O, and SiO$_2$ was ground in an alumina mortar. The mixture was placed in a carbon crucible and melted by the addition of heat. After the reaction, the reaction mixture was rapidly cooled by injection into liquid nitrogen. The reaction mixture obtained in this way was ground in a mortar to 200 mesh or finer, and the product was a silver-ion conductive solid electrolyte of the formula $3AgI.Ag_4SiO_4$.

The compound oxide of the formula $Ag_{0.6}V_2O_5$ obtained in Example 2 as the electrode active material was mixed with the above silver-ion conductive solid electrolyte in a 1:1 ratio by weight, and the mixture was used as the positive-electrode material of the solid-state electrochemical cell. Then, 150 mg of this electrode material was formed into a positive-electrode pellet of 10 mm$\phi$ with the application of 4 tons/cm$^2$ pressure.

The compound oxide of the formula $Ag_{0.7}V_2O_5$ obtained in Example 1 was mixed with the above silver-ion conductive solid electrolyte in a 1:1 ratio by weight, and the mixture was used as the negative-electrode material. Then, 200 mg of this electrode material was formed into a negative-electrode pellet of 10 mm$\phi$ with the application of 4 tons/cm$^2$ pressure.

Next, 400 mg of the solid electrolyte was disposed between the positive-electrode pellet and the negative-electrode pellet, and the whole was formed into cell contents with the application of 4 tons/cm$^2$ pressure. The cell contents were connected with tin-plated copper leads as the terminals by the use of carbon paste, and then sealed by the application of epoxy resin overall, resulting in a solid-state electrochemical cell 25.

The solid-state electrochemical cell 25 obtained in this way had
$M = 3.0 \times 10^{-4}$ mol,
$N = 3.9 \times 10^{-4}$ mol,
$Q_1 = 8.8 \times 10^{-5}$,
and $Q_2 = 9.3 \times 10^{-5}$.
Therefore, the condition that $Q_1 \leq Q_2$ was satisfied.

The compound oxide of the formula $Ag_{0.6}V_2O_5$ obtained in Example 2 was mixed with the above silver-ion conductive solid electrolyte in a 1:1 ratio by weight, and the mixture was as the negative-electrode material. In the same way as described above, except for the use of this material, a solid-state electrochemical cell 26 was produced.

The solid-state electrochemical cell 26 obtained in this way had
$M = 3.0 \times 10^{-4}$ mol,
$N = 4.1 \times 10^{-4}$ mol,
$Q_1 = 8.8 \times 10^{-5}$,
and $Q_2 = 7.3 \times 10^{-5}$.
Therefore, the condition that $Q_1 \leq Q_2$ was not satisfied.

The charge and discharge characteristics of the cells were evaluated as in Example 2. The results showed that a minute electrical short developed in the solid-state electrochemical cell 26 after 216 repeats of the cycle of charging and discharging. With the solid-state electrochemical cell 25, there was no change in the charge and discharge characteristics after 300 repeats of the cycle.

EXAMPLE 7

This example describes the production and evaluation of a data memory cell that has a solid-state battery of this invention and 256-kb C-MOS static RAM memory chips.

The solid electrolyte and the compound oxide obtained in Example 1 were mixed together in a 1:1 ratio by weight, and the mixture was used as the electrode material. Then, 10 mg of the electrode material obtained was formed into a positive-electrode pellet of 4×2 mm with the application of 4 tons/cm$^2$ pressure. Also, 20 mg of the same electrode material was formed into a negative-electrode pellet of 4×2 mm with the application of 4 tons/cm$^2$ pressure.

Then, 10 mg of the solid electrolyte was disposed between the positive-electrode pellet and the negative-electrode pellet obtained above, and the whole was formed with the application of 4 tons/cm$^2$ pressure, resulting in a solid-state battery.

Next, twelve of the solid-state batteries obtained were connected in series to the plane of the lead frame opposite the semiconductor element chips, and the resin packaging was made by the application of epoxy resin to the whole and the hardening of the resin at 180° C., resulting in a data memory cell in one piece with the miniature power source contained in the resin packaging.

The data memory cell obtained in this way was stored at 100° C. for 100 days, and its operating characteristics were then investigated. There were no abnormalities, and a data memory cell in one piece with a miniature power source could be obtained.

EXAMPLE 8

A 4:1:2 molar mixture of AgI, $Ag_2O$, and $CrO_3$ was ground in an alumina mortar. The mixture was formed into pellets with the application of pressure, and the pellets were put into a quartz tube that was then sealed at reduced pressure. The tube was heated at 700° C. for 17 hours, so that the mixture was melted and allowed to react. The quartz tube was then cooled rapidly in cold water. The reaction mixture obtained in this way was ground in a mortar to 200 mesh or finer, and the product was a silver-ion conductive solid electrolyte of the formula $4AgI \cdot Ag_2Cr_2O_7$.

In the same way as in Example 7, except for the use of the above silver-ion conductive solid electrolyte, a data memory cell in one piece with a miniature power source was produced.

The data memory cell obtained in this way was stored at 100° C. for 100 days, and its operating characteristics were then investigated. There were no abnormalities.

EXAMPLE 9

This example describes the use of the solid-state electrochemical cell of this invention in a solid-state analogue memory cell.

With the use of a silver-ion conductive solid electrolyte of the formula $4AgI \cdot Ag_2WO_4$ and a compound oxide of the formula $Ag_{0.7}V_2O_5$, both of which were obtained in Example 1, a solid-state electrochemical cell that contained a compound oxide of the formula $Ag_{0.7}V_2O_5$ as the material for the working electrode and counter electrode was produced as follows.

The solid electrolyte and the compound oxide were mixed at the ratio of 1:1 by weight, and the mixture was used as the electrode material. Then, 200 mg of this electrode material was formed into a working electrode pellet of 10 mm$\phi$ and a counter electrode pellet of 10 mm$\phi$ with the application of 4 tons/cm$^2$ pressure.

Next, 400 mg of the solid electrolyte was disposed between these electrode pellets, and the whole was formed with the application of 4 tons/cm$^2$ pressure, resulting in a solidstate electrochemical cell. This solid-state electrochemical cell was connected with tin-plated copper leads as the terminals by the use of carbon paste, and then sealed by the application of epoxy resin overall, resulting in a solid-state analogue memory cell.

At this time, the amount of silver capable of being deintercalated from the working electrode was $8.2 \times 10^{-5}$ mol, and the amount of silver capable of being intercalated in the counter electrode was b $9.3 \times 10^{-5}$ mol. Therefore, the condition $Q_1 \leq Q_2$ was satisfied where $Q_1 = M(0.7x - 0.28)$ and $Q_2 = N(0.6v - 0.18)$.

The solid-state electrochemical cell obtained in this way was evaluated for the relationship between the electricity and the terminal voltage, the charging and discharging cycle characteristics, and the capacity to store the terminal voltage.

Figure 9:
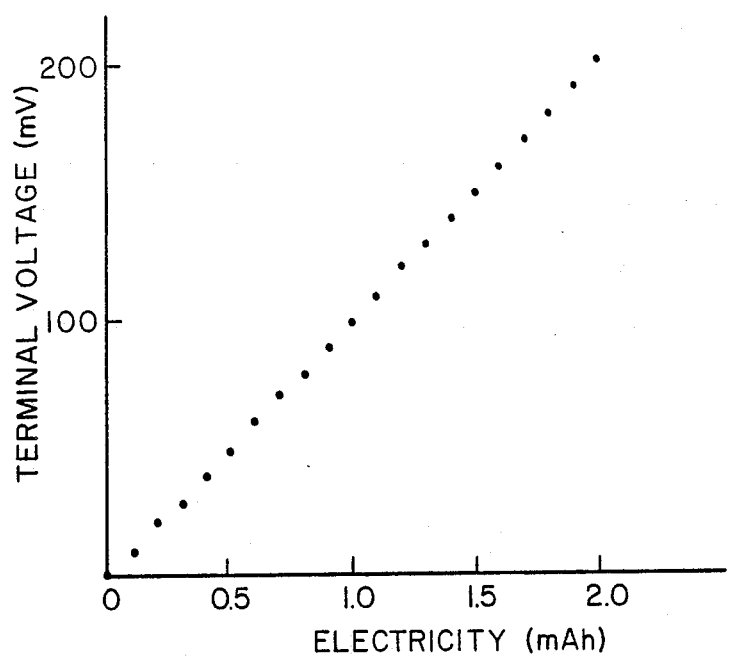
FIG. 9 is a graph showing the relationship between the electricity and the terminal voltage of the solid-state electrochemical cell obtained in Example 9 of this invention.

The linearity of the relationship between the electricity and the terminal voltage was evaluated as follows. First, constant current pulses of 100 μA for 12 minutes were applied to the cell, and the terminal voltage after 30 minutes of the application of constant current pulses was measured. The results are shown in FIG. 9. The x-axis shows the electricity, and the y-axis shows the terminal voltage. The relationship between the electricity and the terminal voltage was linear, indicating that the solid-state electrochemical cell of this invention has excellent linearity of the relationship between the electricity and the terminal voltage.

Figure 10:
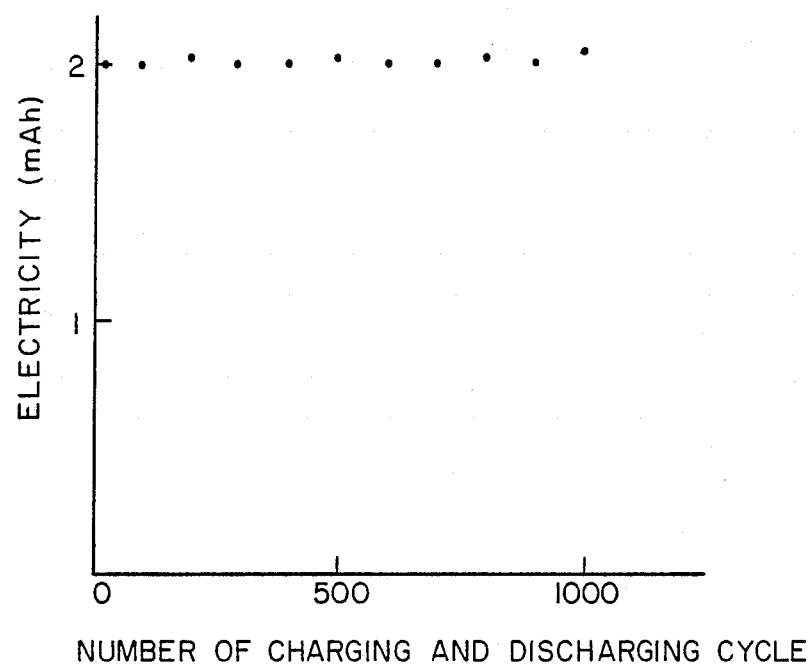
FIG. 10 is a graph showing the charging and discharging characteristics of the solid-state electrochemical cell obtained in Example 9 of this invention.

The charging and discharging cycle characteristics was evaluated as follows. With the use of a solid-state electrochemical cell, a test of charging and discharging cycles at the current of 500 μA and the voltage of 0 to 230 mV was conducted. The results are shown in FIG. 10. The y-axis shows the electricity, and the x-axis shows the number of cycles. After 1000 repeats of the cycle, the electricity was almost unchanged, indicating that the solid-state electrochemical cell had excellent cycle characteristics.

Figure 11:
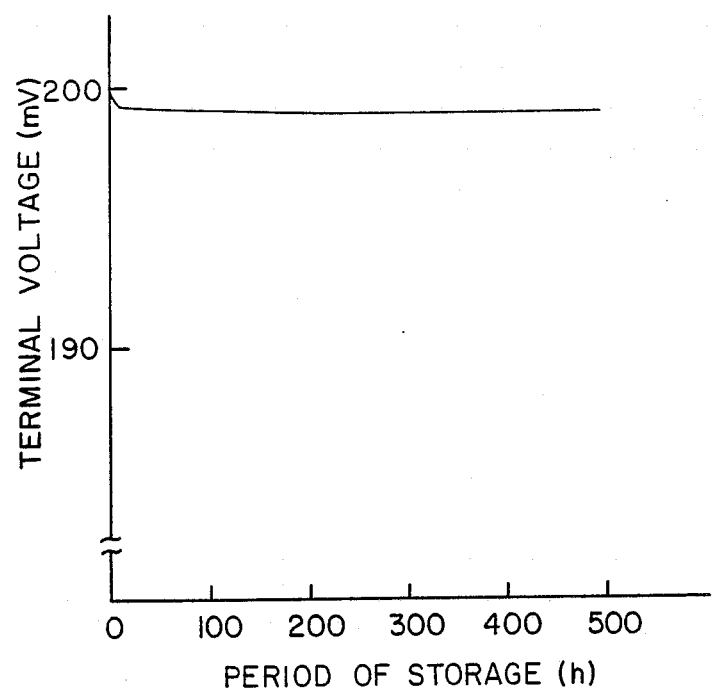
FIG. 11 is a graph showing the terminal-voltage storage characteristics of the solid-state electrochemical cell obtained in Example 9 of this invention.

The capacity to store the terminal voltage was evaluated as follows. The solid-state electrochemical cell was charged at 200 mV for 24 hours. Then, the change in the terminal voltage after the removal of the cell from the circuit was measured with the passage of time. The results are shown in FIG. 11. The figure shows that when the cell was removed from the circuit, the polarization of the electrodes caused changes in the voltage, but thereafter, large changes did not occur. After 500 hours, the terminal voltage was 199 mV. This indicates that the solid-state electrochemical cell could maintain the terminal voltage during the storage for long periods of time.

EXAMPLE 10

The silver-ion conductive solid electrolyte of the formula $5AgI\cdot3Ag_2O\cdot2V_2O_5$ obtained in Example 5 and the compound oxide of the formula $Ag_{0.5}V_2O_5$ obtained in Example 2 were used to produce a solid-state analogue cell.

The above-mentioned solid electrolyte and the compound oxide were mixed at the ratio of 2:1 by weight, and the mixture was used as the electrode material for the working electrode. Then, powdered metal silver and the above-mentioned solid electrolyte were mixed at the ratio of 1:1 by weight, and the mixture was used as the electrode material for the counter electrode.

In the same way as in Example 9, except for the use of the electrode material obtained above, a solid-state analogue memory cell was produced.

Figure 13:
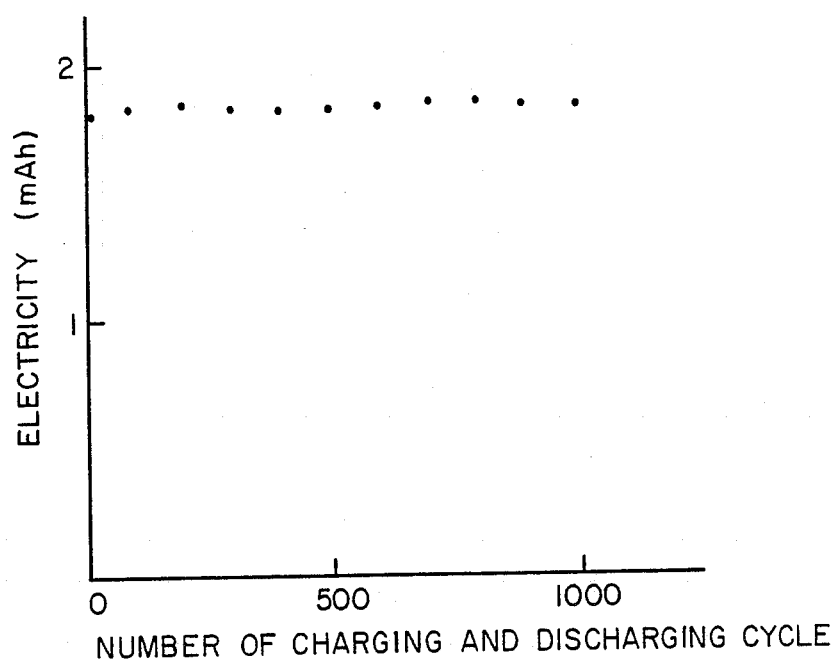
FIG. 13 is a graph showing the charging and discharging cycle characteristics of the solid-state electrochemical cell obtained in Example 10 of this invention.
Figure 14:
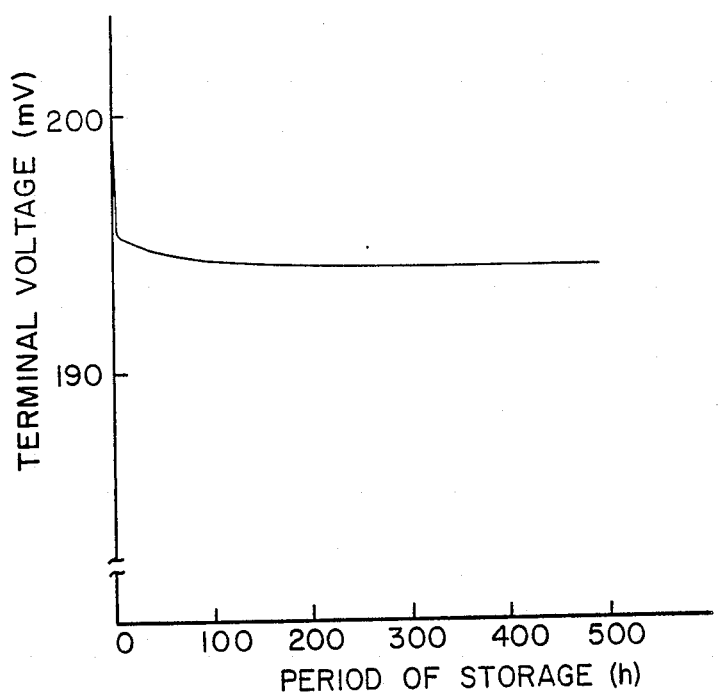
FIG. 14 is a graph showing the terminal-voltage storage characteristics of the solid-state electrochemical cell obtained in Example 10 of this invention.

Both electrodes of the solid-state electrochemical cell obtained as described above were allowed to stand for 24 hours with an electrical short therebetween. Then, the terminal voltage was allowed to fall to 0 V, after which the linearity between the electricity and the terminal voltage, the charging and discharging cycle characteristics, and the capacity to store the terminal voltage were evaluated in the same way as in Example 9. The results are shown in FIGS. 12, 13, and 14.

Figure 12:
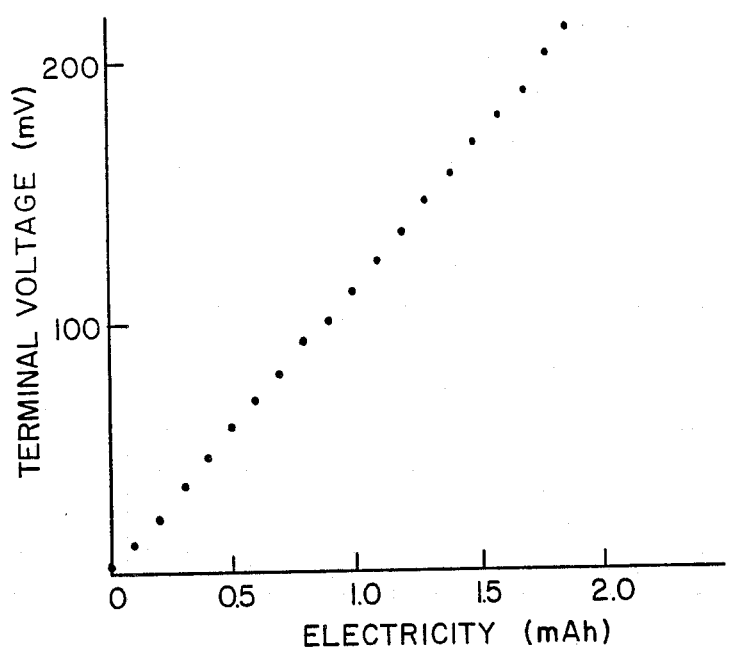
FIG. 12 is a graph showing the relationship between the electricity and the terminal-voltage of the solid-state electrochemical cell obtained in Example 10 of this invention.

FIG. 12 indicates that the solid-state analogue memory cell of this invention had excellent linearity between the electricity and the terminal voltage. FIG. 13 indicates that there was almost no change in the charged after 1000 repeats of the cycle and therefore that the solid-state analogue memory cell had excellent cycle charge and discharge characteristics. FIG. 14 indicates that the terminal voltage after 500 hours was 194 mV and therefore the solid-state analogue memory cell of this invention maintain the terminal voltage during the storage for a long period of time.

EXAMPLE 11

A compound oxide of silver and molybdenum was used as the electrode active material instead of a compound oxide of silver and vanadium, and a solid-state electrochemical cell was produced in the same way as in Example 1. This cell was evaluated for charge and discharge characteristics. Although the electrical capacity and rate characteristics were inferior to those in Example 1, the solid-state electrochemical cell of this example operated satisfactorily in the air.

EXAMPLE 12

A compound oxide of silver and tungsten was used as the electrode active material instead of a compound oxide of silver and vanadium, and a solid-state electrochemical cell was produced in the same way as in Example 1. This electrochemical cell was evaluated for charge and discharge characteristics. Although the electrical capacity and rate characteristics were inferior to those in Example 1, the solid-state electrochemical cell of this example operated satisfactorily in the air.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A solid-state electrochemical cell comprising at least one pair of electrodes and a silver-ion conductive solidelectrolyte layer disposed between the electrodes, wherein at least one of said electrodes contains as an electrode active material a compound oxide composed of silver and transition metal oxide.

2. A solid-state electrochemical cell according to claim 1, wherein said transition metal oxide comprises vanadium oxide.

3. A solid-state electrochemical cell according to claim 1, wherein said compound oxide is of the formula $Ag_xV_2O_{5-y}$ (where $x>0.35$ and $0\leq y<5$).

4. A solid-state electrochemical cell according to claim 1, which is used as a solid-state rechargeable battery, wherein said pair of electrodes are a positive electrode and negative electrode for said battery and wherein at least one of said positive electrode and negative electrode contains a compound oxide of the formula $Ag_xV_2O_{5-y}$ (where $0.6\leq x\leq 0.8$ and $0\leq y<5$).

5. A solid-state electrochemical cell according to claim 4, wherein said positive electrode contains a compound oxide of the formula $Ag_xV_2O_{5-y}$ (where $0.6\leq x\leq 0.8$ and $0\leq y<5$) and said negative electrode contains a compound oxide of the formula $Ag_vV_2O_{5-w}$ (where $0.6\leq v\leq 0.8$ and $0\leq w<5$).

6. A solid-state electrochemical cell according to claim 5, wherein when said positive electrode contains M mol of $Ag_xV_2O_{5-y}$ and said negative electrode contains N mol of $Ag_yV_2O_{5-w}$, the condition $Q_1 \leq Q_2$ is satisfied (where $Q_1 = M)(1.4x - 0.55)$ when $0.6 \leq x \leq 0.7$, and $Q_1 = M(0.6x + 0.01)$ when $0.7 \leq x \leq 0.8$; $Q_2 = N(0.6v - 0.18)$ when $0.6 \leq v \leq 0.7$, and $Q_2 = N(-0.6v + 0.66)$ when $0.7 \leq v \leq 0.8$).

7. A solid-state electrochemical cell according to claim 1, which is used as a solid-state analogue memory cell, wherein said pair of electrodes are a working electrode and counter electrode for said memory cell and wherein at least one of said working electrode and counter electrode contains a compound oxide of the formula $Ag_xV_2O_{5-y}$ (where $x > 0.35$ and $0 \leq y < 5$).

8. A solid-state electrochemical cell according to claim 7, wherein said working electrode contains a compound oxide of the formula $Ag_xV_2O_{5-y}$ (where $x > 0.35$ and $0 \leq y < 5$) and said counter electrode contains a compound oxide of the formula $Ag_yV_2O_{5-w}$ (where $v > 0.35$ and $0 \leq w < 5$).

9. A solid-state electrochemical cell according to claim 8, wherein when said working electrode contains M mol of $Ag_xV_2O_{5-y}$ and said counter electrode contains N mol of $Ag_yV_2O_{5-w}$, the condition $Q_1 \leq Q_2$ is satisfied (where $Q_1 = M(0.7x - 0.28)$ when $x > 0.35$; $Q_2 = N(0.6v - 0.18)$ when $0.35 < v \leq 0.7$, and $Q_2 = N(-0.6v + 0.66)$ when $v \geq 0.7$).

10. A solid-state electrochemical cell according to claim 7, wherein said working electrode contains a compound oxide of the formula $Ag_xV_2O_{5-y}$ (where $x > 0.35$ and $0 \leq y < 5$) and said counter electrode contains metal silver.

11. A solid-state electrochemical cell according to claim 7, wherein said compound oxide is of the formula $Ag_xV_2O_{5-y}$ (where $0.35 < x \leq 0.8$ and $0 \leq y < 5$).

12. A solid-state electrochemical cell according to claim 1, wherein said silver-ion conductive solid electrolyte layer is composed of $aAgX-bAg_2O-cM_kO_l$ (where X is selected from the group consisting of I, Br, and Cl; M is selected from the group consisting of W, Mo, Si, V, Cr, P, and B; and the relationships $0.1 \leq a/(a+b+c) \leq 1.0$ and $2/7 \leq k/l \leq 2/3$ are satisfied).

13. A solid-state electrochemical cell according to claim 1, wherein said silver-ion conductive solid electrolyte layer is composed of $pAgX-aAgM_mO_n$ (where X is selected from the group consisting of I, Br, and Cl; M is selected from the group consisting of W, Mo, Si, V, Cr, P, and B; and the relationships $0.1 \leq p/(p+q) \leq 1.0$ and $1/5 \leq m/n \leq 2/3$ are satisfied).

* * * * *